United States Patent
Zhuo et al.

(10) Patent No.: US 9,467,093 B2
(45) Date of Patent: Oct. 11, 2016

(54) SINGLE ENDED RECEIVER WITH A MULTI-PORT TRANSFORMER AND SHARED MIXER

(71) Applicant: QUALCOMM Incorporated, San Diego, CA (US)

(72) Inventors: Wei Zhuo, San Diego, CA (US); Ojas M Choksi, San Diego, CA (US); Prasad Srinivasa Siva Gudem, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/645,265

(22) Filed: Oct. 4, 2012

(65) Prior Publication Data

US 2013/0295870 A1 Nov. 7, 2013

Related U.S. Application Data

(60) Provisional application No. 61/618,494, filed on Mar. 30, 2012.

(51) Int. Cl.
| | |
|---|---|
| H04B 1/26 | (2006.01) |
| H03D 7/14 | (2006.01) |
| H04B 1/38 | (2015.01) |
| H04L 25/00 | (2006.01) |
| H04B 1/00 | (2006.01) |
| H04B 1/18 | (2006.01) |

(52) U.S. Cl.
CPC ............ *H03D 7/1466* (2013.01); *H04B 1/005* (2013.01); *H04B 1/18* (2013.01)

(58) Field of Classification Search
CPC ...... H04B 1/005; H04B 1/18; H03D 7/1466; H03D 7/14; H03H 7/42; H03H 7/463; H01P 5/12
USPC ............ 455/334, 179.1, 303, 292, 326, 333, 455/180.1, 293, 266, 130, 143, 168.1, 455/176.1, 225, 230, 252.1, 275; 336/223, 336/200, 232; 343/700, 795, 859; 333/25
See application file for complete search history.

(56) References Cited

U.S. PATENT DOCUMENTS

| | | | | |
|---|---|---|---|---|
| 4,779,058 | A | * | 10/1988 | Meyer .......................... 330/188 |
| 4,816,784 | A | * | 3/1989 | Rabjohn ..................... 333/24 R |
| 6,259,325 | B1 | | 7/2001 | Ishizuka et al. |
| 6,275,687 | B1 | | 8/2001 | Lloyd |

(Continued)

FOREIGN PATENT DOCUMENTS

EP 2204907 A1 7/2010

OTHER PUBLICATIONS

International Search Report and Written Opinion—PCT/US2013/034738—ISA/EPO—Jul. 22, 2013.

*Primary Examiner* — Pablo Tran
(74) *Attorney, Agent, or Firm* — Rupit M. Patel (57) ABSTRACT

A single-ended receiver is described. The single-ended receiver includes a multi-port transformer that outputs a differential signal. The multi-port transformer includes a first primary coil that is coupled to an output of a first low noise amplifier. The multi-port transformer also includes a second primary coil that is coupled to an output of a second low noise amplifier. The multi-port transformer further includes a first secondary coil. The single-ended receiver also includes a shared mixer that receives the differential signal from the multi-port transformer.

42 Claims, 10 Drawing Sheets

(56) References Cited

U.S. PATENT DOCUMENTS

| | | | |
|---|---|---|---|
| 6,326,922 B1* | 12/2001 | Hegendoerfer | 343/700 MS |
| 6,707,367 B2* | 3/2004 | Castaneda et al. | 336/200 |
| 7,088,214 B2* | 8/2006 | Castaneda et al. | 336/200 |
| 7,120,414 B2* | 10/2006 | Kim et al. | 455/313 |
| 7,224,231 B2* | 5/2007 | Wu | 330/301 |
| 7,245,655 B1* | 7/2007 | Javor et al. | 375/216 |
| 7,333,565 B2* | 2/2008 | Oono et al. | 375/307 |
| 7,369,096 B2* | 5/2008 | Castaneda et al. | 343/859 |
| 7,489,192 B2 | 2/2009 | Vitzilaios et al. | |
| 7,526,256 B2* | 4/2009 | Bhatti et al. | 455/73 |
| 7,592,866 B2* | 9/2009 | Meharry | 330/195 |
| 7,599,675 B2* | 10/2009 | Mu et al. | 455/240.1 |
| 7,688,146 B2* | 3/2010 | Kao et al. | 330/301 |
| 7,796,970 B2* | 9/2010 | Rofougaran et al. | 455/333 |
| 7,825,746 B2* | 11/2010 | Yeung et al. | 333/185 |
| 7,944,296 B1 | 5/2011 | Lee et al. | |
| 7,970,367 B1* | 6/2011 | Groe | 455/133 |
| 7,973,636 B2* | 7/2011 | Yoon et al. | 336/223 |
| 7,978,024 B2* | 7/2011 | Cheng | 333/126 |
| 7,979,043 B2* | 7/2011 | Rofougaran | 455/292 |
| 8,126,096 B2* | 2/2012 | Yang et al. | 375/347 |
| 8,208,887 B2* | 6/2012 | Lee et al. | 455/292 |
| 8,270,499 B2* | 9/2012 | Chang et al. | 375/258 |
| 8,306,494 B2* | 11/2012 | Ojo | 455/248.1 |
| 8,503,963 B2* | 8/2013 | Sivonen et al. | 455/307 |
| 8,620,243 B2* | 12/2013 | Thompson et al. | 455/130 |
| 8,699,977 B2* | 4/2014 | Babitch et al. | 455/150.1 |
| 8,750,817 B2* | 6/2014 | Li | 455/296 |
| 8,923,780 B2* | 12/2014 | Ojo et al. | 455/78 |
| 2002/0008667 A1* | 1/2002 | Nguyen et al. | 343/715 |
| 2003/0114129 A1* | 6/2003 | Jerng | 455/323 |
| 2006/0270377 A1 | 11/2006 | Bhatti et al. | |

* cited by examiner

SINGLE ENDED RECEIVER WITH A MULTI-PORT TRANSFORMER AND SHARED MIXER

CLAIM OF PRIORITY UNDER 35 U.S.C. §119

The present application for patent claims priority to Provisional Application No. 61/618,494, entitled "Single-ended receiver with a multi-port transformer and shared mixer" filed Mar. 30, 2012, and assigned to the assignee hereof and hereby expressly incorporated by reference herein.

TECHNICAL FIELD

The present disclosure relates generally to electronic devices for communication systems. More specifically, the present disclosure relates to systems and methods for a single-ended receiver with a multi-port transformer and shared mixer.

BACKGROUND

Wireless communication systems are widely deployed to provide various types of communication content such as voice, video, data, and so on. These systems may be multiple-access systems capable of supporting simultaneous communication of multiple terminals with one or more base stations.

A terminal or a base station may include one or more integrated circuits. These integrated circuits may include analog and digital circuitry necessary for wireless communication. Such circuitry may include inductors. As the technology used to build integrated circuits progresses, some elements on the integrated circuit such as transistors continue to decrease in size. However, some elements, such as passive elements, have not decreased in size as quickly. Therefore, benefits may be realized by simplifying an integrated circuit.

SUMMARY OF THE INVENTION

A single-ended receiver is described. The single-ended receiver includes a multi-port transformer that outputs a differential signal. The multi-port transformer includes a first primary coil that is coupled to an output of a first low noise amplifier. The multi-port transformer also includes a second primary coil that is coupled to an output of a second low noise amplifier. The multi-port transformer further includes a first secondary coil. The single-ended receiver also includes a shared mixer that receives the differential signal from the multi-port transformer.

The multi-port transformer may include a first coupling between the first primary coil and the second primary coil, a second coupling between the first primary coil and the first secondary coil and a third coupling between the second primary coil and the first secondary coil. The first low noise amplifier may receive a first input signal and the second low noise amplifier may receive a second input signal.

The first input signal may be active, the second input signal may be inactive and the multi-port transformer may output the differential signal based on the first input signal. The first input signal may be inactive, the second input signal may be active and the multi-port transformer outputs the differential signal based on the second input signal. The first input signal may include a first frequency and the second input signal may include a second frequency.

The multi-port transformer may further include a center tap between the first primary coil and the second primary coil. The first low noise amplifier may include a low-frequency low noise amplifier for operation with a low-frequency signal and the second low noise amplifier may include a high-frequency low noise amplifier for operation with a high-frequency signal. The first low noise amplifier may receive a low-frequency input signal and the second low noise amplifier may receive a high-frequency second signal.

The single-ended receiver may also include a baseband low pass filter coupled to the shared mixer. The single-ended receiver of may also include an analog-to-digital converter coupled to the baseband low pass filter. The baseband low pass filter may output a receiver output signal.

The first secondary coil may be coupled to a first shared mixer input and a second shared mixer input of the shared mixer. The single-ended receiver may also include a first capacitor coupled between the first secondary coil and the first shared mixer input and a second capacitor coupled between the first secondary coil and the second shared mixer input.

The single-ended receiver may include an additional first low noise amplifier parallel with the first low noise amplifier and an additional second low noise amplifier parallel with the second low noise amplifier. The additional first low noise amplifier may receive a first input signal. The additional second low noise amplifier may receive a second input signal. The first input signal may have a first frequency and the second input signal has a second frequency.

A method for receiving a wireless signal is also described. A first input signal is received. A second input signal is received. A differential signal is provided to a shared mixer from one of the first input signal and the second input signal using a multi-port transformer An apparatus is also described. The apparatus includes means for receiving a first input signal. The apparatus also includes means for receiving a second input signal. The apparatus further includes means for providing a differential signal to a shared mixer from one of the first input signal and the second input signal using a multi-port transformer.

A computer-program product for receiving a wireless signal is also described. The computer-program product includes a non-transitory computer-readable medium having instructions for causing a wireless device to receive a first input signal. The computer-readable medium also includes instructions for causing the wireless device to receive a second input signal. The computer-readable medium further includes instructions for causing the wireless device to provide a differential signal to a shared mixer using a multi-port transformer from one of the first input signal and the second input signal.

DETAILED DESCRIPTION

Figure 1:
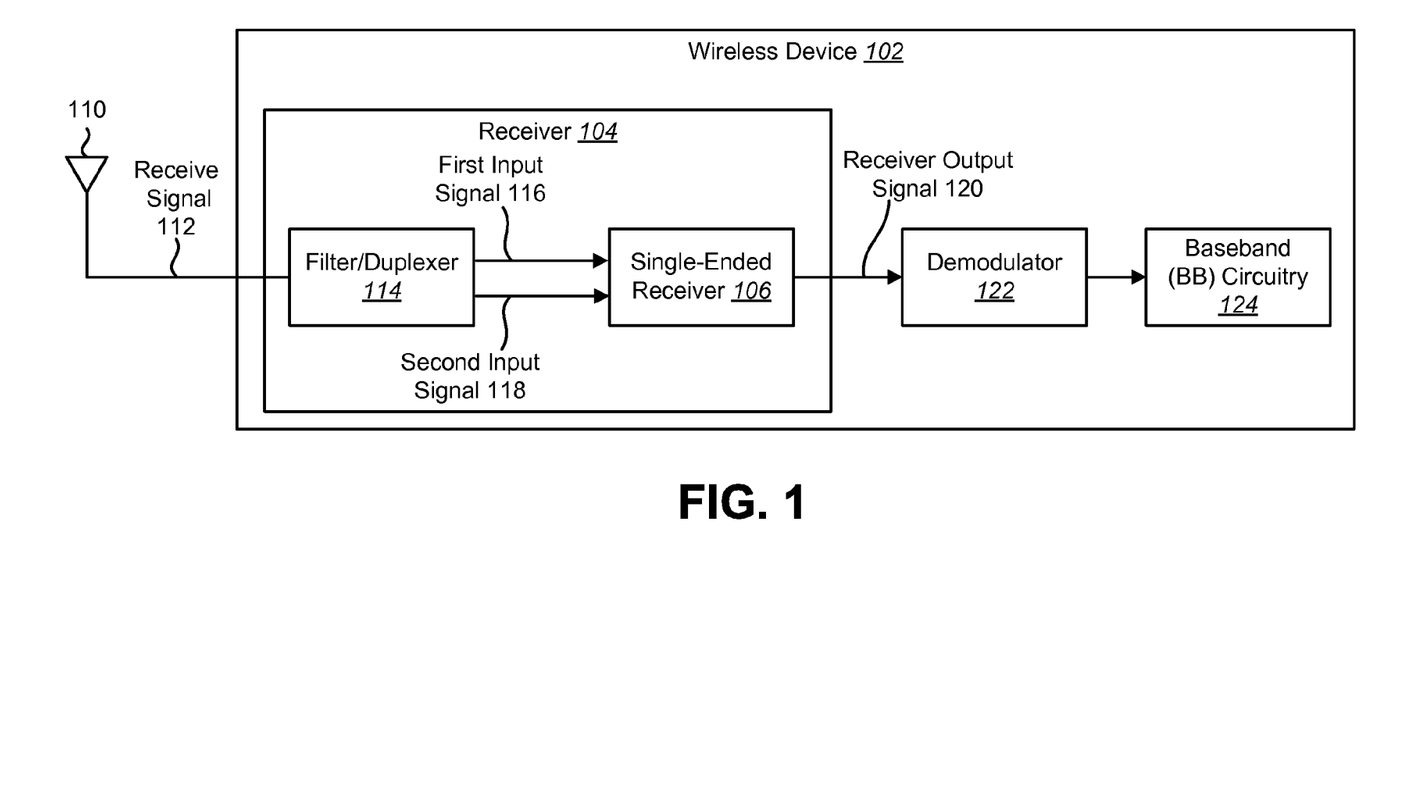
FIG. 1 is a block diagram illustrating a wireless device that uses a single-ended receiver.

FIG. 1 is a block diagram illustrating a wireless device 102 that uses a single-ended receiver 106. The wireless device 102 may be a wireless communication device or a base station.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

The wireless communication device may operate in a wireless communication system that includes other wireless devices, such as base stations. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area, depending on the context in which the term is used.

Communications in a wireless communication system (e.g., a multiple-access system) may be achieved through transmissions over a wireless link. Such a communication link may be established via a single-input and single-output (SISO) or a multiple-input and multiple-output (MIMO) system. A multiple-input and multiple-output (MIMO) system includes transmitter(s) and receiver(s) equipped, respectively, with multiple (NT) transmit antennas and multiple (NR) receive antennas for data transmission. SISO systems are particular instances of a multiple-input and multiple-output (MIMO) system. The multiple-input and multiple-output (MIMO) system can provide improved performance (e.g., higher throughput, greater capacity or improved reliability) if the additional dimensionalities created by the multiple transmit and receive antennas are utilized.

The wireless communication system may utilize both single-input and multiple-output (SIMO) and multiple-input and multiple-output (MIMO). The wireless communication system may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, 3rd Generation Partnership Project (3GPP) Long Term Evolution (LTE) systems and spatial division multiple access (SDMA) systems.

The wireless device 102 may include receiver 104, a demodulator 122 and baseband (BB) circuitry 124. The receiver 104 may include a filter/duplexer 114. The filter/duplexer 114 may be a surface acoustic wave (SAW) filter/duplexer. The filter/duplexer 114 may receive a receive signal 112 from an antenna 110. The receive signal 112 may be a wireless signal. The filter/duplexer 114 may process and output the receive signal 112 as a first input signal 116 and a second input signal 118. The filter/duplexer 114 may produce the first input signal 116 and the second input signal 118 based on the frequency of the receive signal 112. For example, the filter/duplexer 114 may process and output incoming frequencies under 1 gigahertz (GHz) as the first input signal 116 and incoming frequencies over 1 GHz as the second input signal 118. In some configurations, a duplexer and/or switch may be used in place of, or in addition to, the filter/duplexer 114.

The first input signal 116 may be a low-frequency signal and the second input signal 118 may be a high-frequency signal. In some configurations, the filter/duplexer 114 may process and output a number of input signals. For example, the filter/duplexer 114 may output up to six signals.

The receiver 104 may include a single-ended receiver 106. The single-ended receiver 106 may receive the first input single 116 and/or the second input signal 118 from the filter/duplexer 114. As a result, the single-ended receiver 106 is not required to receive a differential signal. The single-ended receiver 106 may operate using a single signal front-end. In other words, only a single input signal is required for the single-ended receiver 106. This is in contrast to a differential front-end, which requires multiple input signals to operate.

One benefit of using a single-ended receiver 106 is that the amount of circuit components may be reduced. For example, only one input pin is required for a single-ended receiver 106. In contrast, two input pins are required for a differential receiver to operate. Thus, the number of input pins required is reduced when the receiver 104 includes a single-ended receiver 106.

A receiver 104 that has less components may consume a smaller die/chip area. Additionally, using fewer components requires less power to be consumed by the wireless device 102. Thus, the use of a single-ended receiver 106 in a receiver 104 instead of a differential-ended receiver may reduce the power consumption of a wireless device 102.

The single-ended receiver 106 may provide a receiver output signal 120 to the demodulator 122. The demodulator 122 may provide a demodulated signal to the baseband (BB) circuitry 124. The baseband (BB) circuitry 124 may further process the demodulated signal. For example, the baseband (BB) circuitry 124 may further condition the demodulated signal to obtain voice and/or data.

In some configurations of a receiver 104, separate transformers and mixers are required to process each input signal. In other words, for two received signals, two sets of transformers and mixers are required. Thus, as the number of input signals increases, the number of transformers and mixers in the receiver 104 also increases. This then results in an increase in die/chip area and an increase in the amount of current required.

In another configuration of a receiver 104, switches may be employed to switch transformers from processing the first input signal 116 to the second input signal 118. However, type of configuration degrades the quality factor (Q) of the transformer and hence, degrades the signal-to-noise ratio. (SNR). Further, this type of configuration also requires that multiple transformers be used. Thus, benefits may be realized by using a single-ended receiver 106 with a multi-port transformer and a shared mixer.

Figure 2:
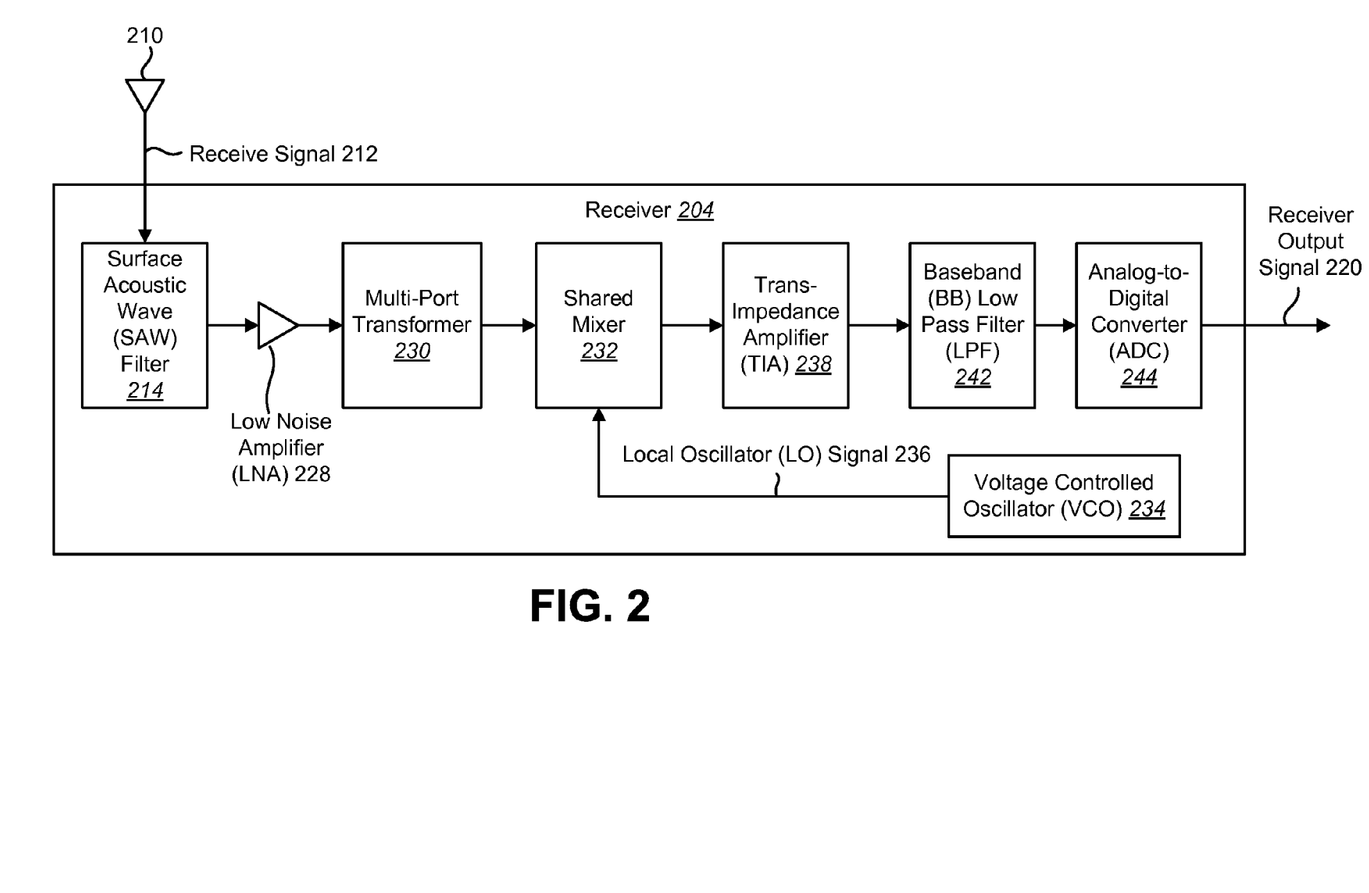
FIG. 2 is a block diagram illustrating one configuration of a receiver for use in the present systems and methods.

FIG. 2 is a block diagram illustrating one configuration of a receiver 204 for use in the present systems and methods. The receiver 204 of FIG. 2 may illustrate one configuration of the receiver 104 described in connection with FIG. 1. The receiver 204 may include a surface acoustic wave (SAW) filter 214, a low noise amplifier (LNA) 228, a multi-port transformer 230, a shared mixer 232, a trans-impedance amplifier (TIA) 238, a baseband (BB) low pass filter (LPF) 242, an analog-to-digital converter (ADC) 244 and a voltage controlled oscillator (VCO) 234.

The receiver 204 may obtain a receive signal 212 using an antenna 210. The receive signal 212 may include one or more frequencies. The receive signal 212 may be passed through the surface acoustic wave (SAW) filter 214 and the low noise amplifier (LNA) 228. The amplified signal may then be passed through the multi-port transformer 230 to the shared mixer 232. The shared mixed 232 may adjust the frequency of the receive signal. The shared mixer 232 may receive a local oscillator (LO) signal 236 from a voltage controlled oscillator (VCO) 234. The output of the shared mixer 232 may be passed through the trans-impedance amplifier (TIA) 238, the baseband (BB) low pass filter (LPF) 242 and the analog-to-digital converter (ADC) 244 to obtain a receiver output signal 220.

Figure 3:
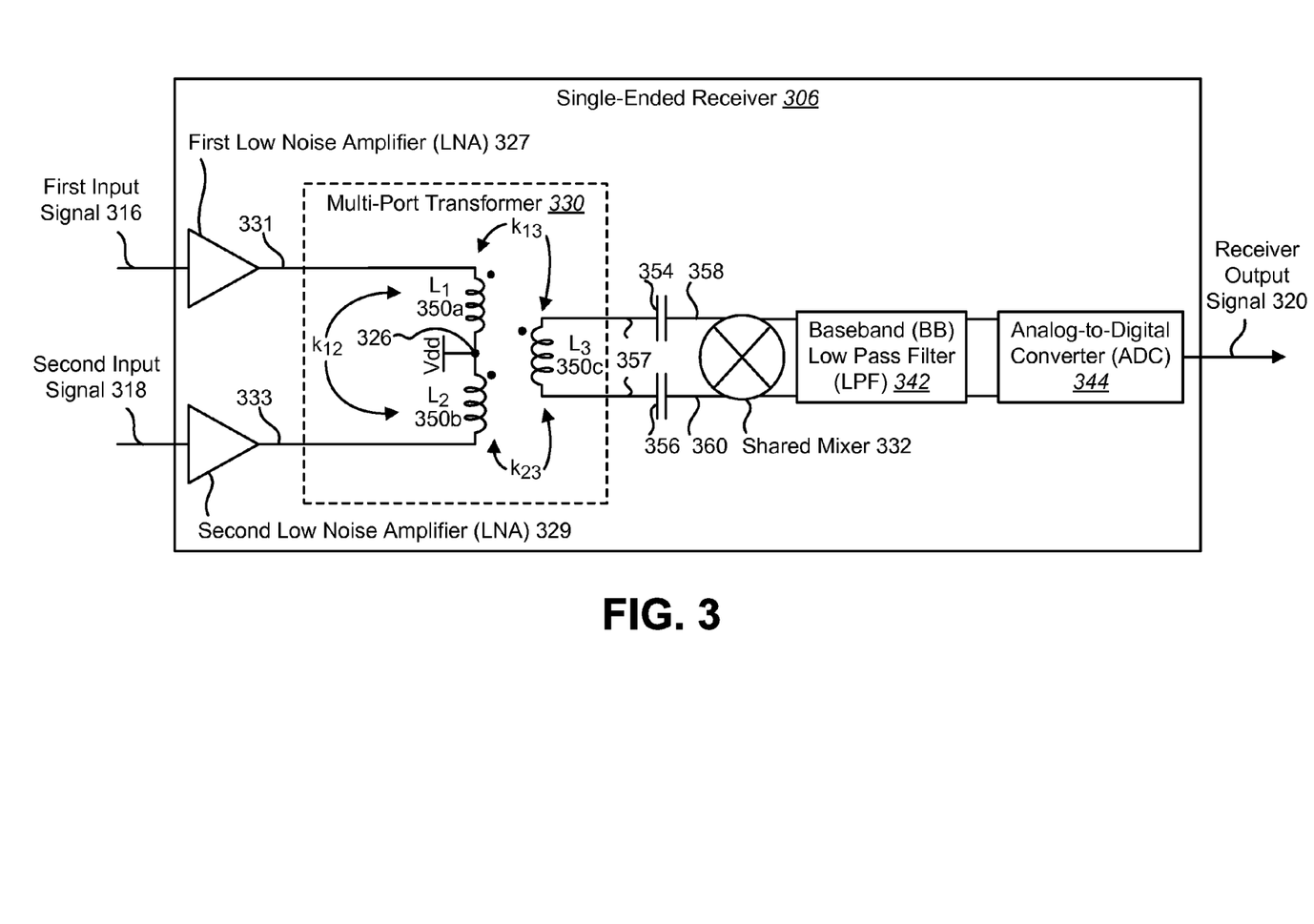
FIG. 3 is a block diagram illustrating one configuration of a single-ended receiver.

FIG. 3 is a block diagram illustrating one configuration of a single-ended receiver 306. The single-ended receiver 306 of FIG. 3 may illustrate one configuration of the single-ended receiver 106 described in connection with FIG. 1. The single-ended receiver 306 may include a multi-port transformer 330, a shared mixer 332, a baseband (BB) low pass filter (LPF) 342 and an analog-to-digital converter (ADC) 344. For simplicity, the single-ended receiver 306 is illustrated with only one channel. However, the channel may include an inphase portion and a quadrature portion.

The single-ended receiver 306 uses a multi-port transformer 330 to produce a differential signal 357 to the shared mixer 332. In one configuration, a low-frequency path and a high-frequency path may share the multi-port transformer 330 and the shared mixer 332. Thus, in this configuration, the number of circuit elements needed to process a receive signal 112 is reduced while avoiding signal-to-noise ratios (SNR) degradation. As a result, signal routing is simplified and current consumption in the single-ended receiver 306 is reduced.

A smaller die/chip size is required and less power is consumed. Reducing the number of inductor components may be especially helpful in reducing the die/chip size. While active circuit components decrease in size due to the advancement of the technology, the size of passive devices, such as inductors, remain the same. Thus, inductors may dominate the die/chip area used. Reducing the number of necessary inductors in an integrated circuit may have a greater effect in reducing the die/chip area than reducing the number of other circuit elements on a receiver 104.

The single-ended receiver 306 may receive a first input signal 316 and a second input signal 318. The first input signal 316 may be provided to a first low noise amplifier (LNA) 327. The second input signal 318 may be provided to a second low noise amplifier (LNA) 329. The first low noise amplifier (LNA) 327 and the second low noise amplifier (LNA) 329 of FIG. 3 may be one configuration of the low noise amplifier (LNA) 228 discussed in connection with FIG. 2. The first low noise amplifier (LNA) 327 and the second low noise amplifier (LNA) 329 may amplify different bands. For example, the first low noise amplifier (LNA) 327 may serve as a low-frequency low noise amplifier (LNA) and the second low noise amplifier (LNA) 329 may serve as a high-frequency low noise amplifier (LNA). In this example, the low-frequency may be at 800 megahertz (MHz) and the high-frequency may be at 1.99 GHz. In general, frequencies less than 1 GHz are referred to as low-frequency bands and frequencies greater than 1 GHz are referred to as high-frequency bands. For example, the low-frequency band may be at 800 megahertz (MHz) and the high-frequency band may be at 1.99 GHz. In some configurations, additional low noise amplifiers (LNA) may be employed to receive additional input signals and/or provide additional amplified input signals to the multi-port transformer 330.

The first low noise amplifier (LNA) 327 may output a first amplified input signal 331. The second low noise amplifier (LNA) 329 may output a second amplified input signal 333. Both the first amplified input signal 331 and the second amplified input signal 333 may be provided to the multi-port transformer 330. The multi-port transformer 330 may include a first primary coil (i.e., inductor) L1 350a, a second primary coil L2 350b and a secondary coil L3 350c. The multi-port transformer 330 may also include a center tap 326 that is between the first primary coil L1 350a and the second primary coil L2 350b. The center tap 326 may be coupled to a voltage supply (Vdd).

A first coupling may occur between the first primary coil L1 350a and the second primary coil L2 350b. The first coupling may have a coupling coefficient of k12. A second coupling may occur between the first primary coil L1 350a and the secondary coil L3 350c. The second coupling may have a coupling coefficient of k13. A third coupling may occur between the second primary coil L2 350b and the secondary coil L3 350c. The third coupling may have a coupling coefficient of k23. In other words, the mutually coupled coils/inductors L1 350a, L2 350b and L3 350c may couple each other (with coupling coefficients k12, k13 and k23).

The output of the first low noise amplifier (LNA) 327 may be coupled to the first primary coil L1 350a. The output of the second low noise amplifier (LNA) 329 may be coupled to the second primary coil L2 350b. The secondary coil L3 350c may be coupled between a first input 358 of a shared mixer 332 and a second input 360 of the shared mixer 332. The first input 358 of the shared mixer 332 and a second input 360 of the shared mixer 332 may be 180 degrees out-of-phase with each other.

In one configuration, either the first input signal 316 or the second input signal 318 is active. If the first input signal 316 is active (and thus the second input signal 318 is inactive), the multi-port transformer 330 may provide a differential signal 357 of the first input signal 316 to the shared mixer 332. Likewise, if the second input signal 318 is active (and thus the first input signal 316 is inactive), the multi-port transformer 330 may provide a differential signal 357 of the second input signal 318 to the shared mixer 332.

As a result of the multi-port transformer 330, only a single shared mixer 332 is required in the single-ended receiver 306 to process both the first input signal 316 and the second input signal 318. As an additional benefit, channel degradation may be reduced and in some cases, eliminated. Furthermore, the single-ended receiver 306 may operate without the use of switches to switch transformers on or off. Because the number of required components is reduced, the single-ended receiver 306 may occupy less die area/printed circuit board area than a differential receiver.

In one configuration, a first capacitor 354 may be coupled between the secondary coil 350c and the first input 358 of the shared mixer 332. Likewise, a second capacitor 356 may be coupled between the secondary coil 350c and the second input 360 of the shared mixer 332. The first capacitor 354 and the second capacitor 356 may tune the differential signal 357 from the multi-port transformer 330 prior to the shared mixer 332. The tuning may vary according to a tuning factor.

The first capacitor 354 and the second capacitors and 356 may be used in a variety of configurations, so long as they are parallel with the multi-port transformer 330. For example, the first capacitor 354 may instead be coupled between an output of the first low noise amplifier (LNA) 327 and the first coil L1 350a and the second capacitor 356 may be coupled between an output of the second low noise amplifier (LNA) 329 and the second coil L2 350b.

The shared mixer 332 may process the differential signal 357. The shared mixer 332 may provide the processed signals to a baseband (BB) low pass filter (LPF) 342. The baseband (BB) low pass filter (LPF) 342 may output a single signal or multiple differential signals. For example, the baseband (BB) low pass filter (LPF) 342 may output a differential I channel signal and a differential Q channel signal. In some cases, the differential I channel signal may include I+ and I− and the differential Q channel signal may include Q+ and Q−. The one or more differential signals output from the baseband (BB) low pass filter (LPF) 342 may be input to an analog-to-digital converter (ADC) 344. The analog-to-digital converter (ADC) 344 may provide at least one receiver output signal 320. For example, the analog-to-digital converter (ADC) 344 may provide digital and single-ended signals. The outputs from the analog-to-digital converter (ADC) 344 may represent the I channel and the Q channel.

Figure 4:
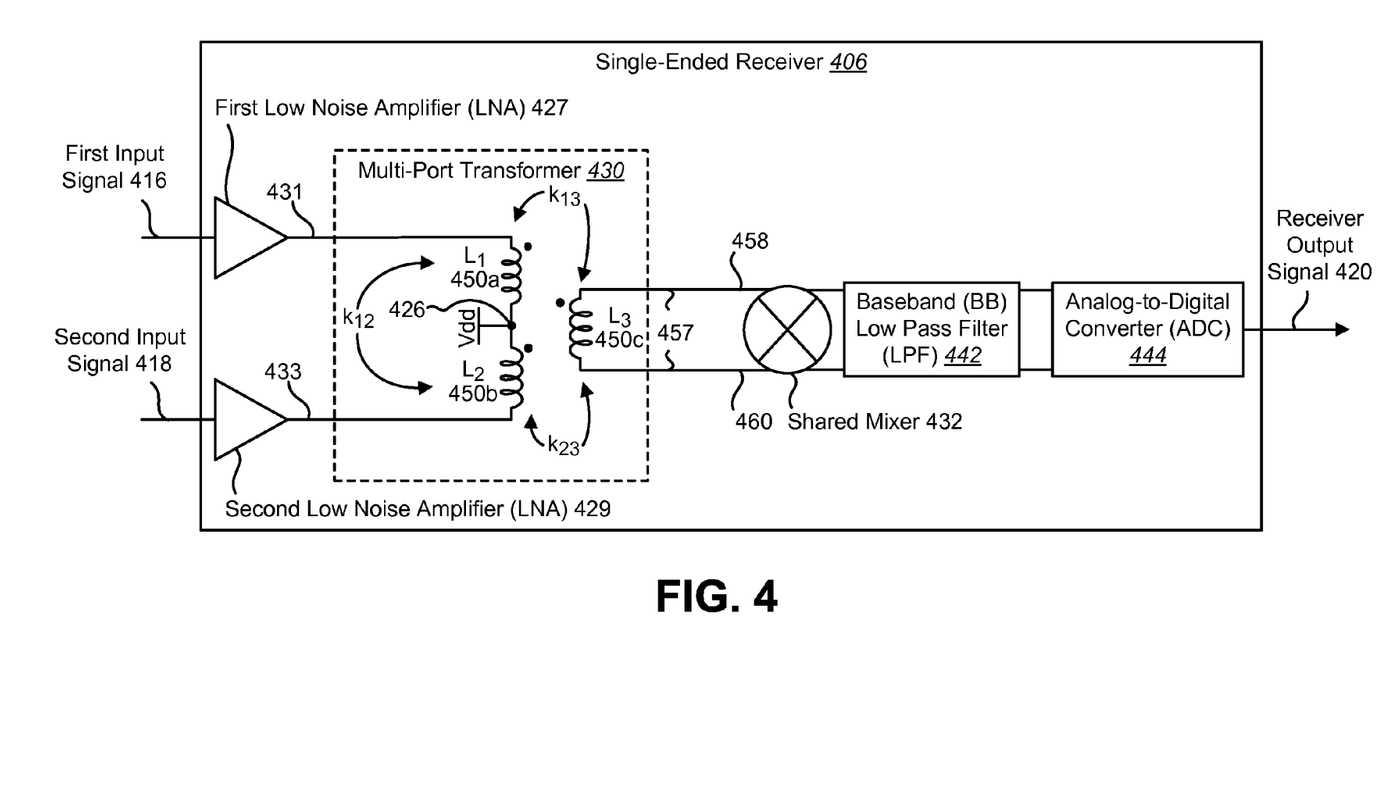
FIG. 4 is a block diagram illustrating another configuration of a single-ended receiver.

FIG. 4 is a block diagram illustrating another configuration of a single-ended receiver 406. The single-ended receiver 406 of FIG. 4 may illustrate one configuration of the single-ended receiver 106 described in connection with FIG. 1. The single-ended receiver 406 may include a low-frequency low noise amplifier (LNA) 427, a high-frequency low noise amplifier (LNA) 429, a multi-port transformer 430, a shared mixer 432, a baseband (BB) low pass filter (LPF) 442 and an analog-to-digital converter (ADC) 444. For simplicity, the single-ended receiver 406 is illustrated with only one channel. However, the channel may include an inphase portion and a quadrature portion.

The multi-port transformer 430 may include a first primary coil (i.e., inductor) L1 450a, a second primary coil L2 450b and a secondary coil L3 450c. The multi-port transformer 430 may also include a center tap 426 that is between the first primary coil L1 450a and the second primary coil L2 450b. The center tap 426 may be coupled to a voltage supply (Vdd).

The single-ended receiver 406 may receive a first input signal 416 and/or a second input signal 418. The first input signal 416 may be amplified by a low-frequency low noise amplifier (LNA) 427. The low-frequency low noise amplifier (LNA) 427 may output a first amplified input signal 431. The output of the low-frequency low noise amplifier (LNA) 427 may be coupled to the first primary coil L1 450a. The first primary coil L1 450a may thus be coupled between the output of the low-frequency low noise amplifier (LNA) 427 and the center tap 426.

The second input signal 418 may be amplified by a high-frequency low noise amplifier (LNA) 429. The high-frequency low noise amplifier (LNA) 429 may output a second amplified input signal 433. The output of the high-frequency low noise amplifier (LNA) 429 may be coupled to the second primary coil L2 450b. The second primary coil L2 450b may thus be coupled between the output of the high-frequency low noise amplifier (LNA) 429 and the center tap 426.

A first coupling may occur between the first primary coil L1 450a and the second primary coil L2 450b. The first coupling may have a coupling coefficient of k12. A second coupling may occur between the first primary coil L1 450a and the secondary coil L3 450c. The second coupling may have a coupling coefficient of k13. A third coupling may occur between the second primary coil L2 450b and the secondary coil L3 450c. The third coupling may have a coupling coefficient of k23. In other words, the mutually coupled coils/inductors L1 450a, L2 450b and L3 450c may couple each other (with coupling coefficients k12, k13 and k23).

The output of the first low noise amplifier (LNA) 427 may be coupled to the first primary coil L1 450a. The output of the second low noise amplifier (LNA) 429 may be coupled to the second primary coil L2 450b. The secondary coil L3 450c may be coupled between a first input 458 of a shared mixer 432 and a second input 460 of the shared mixer 432. The first input 458 of the shared mixer 432 and a second input 460 of the shared mixer 432 may be 180 degrees out-of-phase with each other.

In one configuration, either the first input signal 416 or the second input signal 418 is active. If the first input signal 416 is active (and thus the second input signal 418 is inactive), the multi-port transformer 430 may provide a differential signal 457 of the first input signal 416 to the shared mixer 432. Likewise, if the second input signal 418 is active (and thus the first input signal 416 is inactive), the multi-port transformer 430 may provide a differential signal 457 of the second input signal 418 to the shared mixer 432.

As a result of the multi-port transformer 430, only a single shared mixer 432 is required in the single-ended receiver 406 to process both the first input signal 416 and the second input signal 418. As an additional benefit, channel degradation may be reduced and in some cases, eliminated. Furthermore, the single-ended receiver 406 may operate without the use of switches to switch transformers on or off. Because the number of required components is reduced, the single-ended receiver 406 may occupy less die area/printed circuit board area than a differential receiver.

The shared mixer 432 may downconvert the first shared mixer input signal 458 and the second shared mixer input signal 460 and provide the downconverted signals to the baseband (BB) low pass filter (LPF) 442. The baseband (BB) low pass filter (LPF) 442 provides the filtered downconverted signals to the analog-to-digital converter (ADC) 444. The analog-to-digital converter (ADC) may provide at least one receiver output signal 420.

Figure 5:
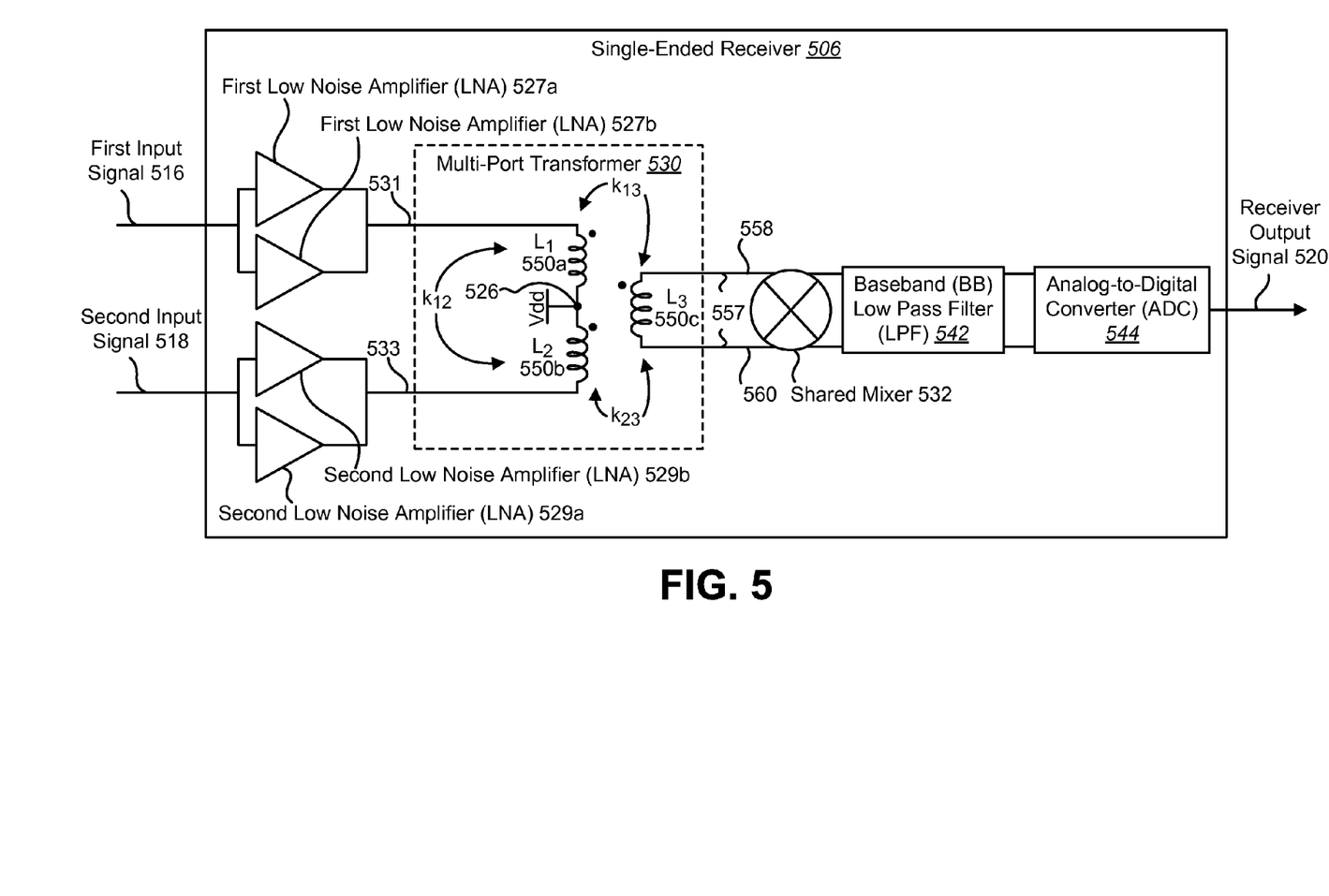
FIG. 5 is a block diagram illustrating yet another configuration of a single-ended receiver.

FIG. 5 is a block diagram illustrating yet another configuration of a single-ended receiver 506. The single-ended receiver 506 of FIG. 5 may illustrate one configuration of the single-ended receiver 106 described in connection with FIG.

1. For simplicity, the single-ended receiver 506 is illustrated with only one channel. However, the channel may include an inphase portion and a quadrature portion.

The single-ended receiver 506 may include multiple low-frequency low noise amplifiers (LNA) 527a-b and multiple a high-frequency low noise amplifiers (LNA) 529a-b. For simplicity, only two low-frequency low noise amplifiers (LNA) 527a-b and two high-frequency low noise amplifiers (LNA) 529a-b are illustrated, but it should be appreciated that more than two low-frequency low noise amplifiers (LNA) 527 and/or more than two high-frequency low noise amplifiers (LNA) 529 may be used. The low-frequency low noise amplifiers (LNA) 527 and high-frequency low noise amplifiers (LNA) 529 may be parallel to each other. For example, low-frequency low noise amplifiers (LNA) 527a and low-frequency low noise amplifiers (LNA) 527b may be parallel to each other.

A first input signal 516 may be amplified by both first low-frequency low noise amplifiers (LNA) 427a-b. The first low-frequency low noise amplifier (LNA) 427b may output a first amplified input signal 431. A second input signal 518 may be amplified by both second low-frequency low noise amplifiers (LNA) 429a-b. The second low-frequency low noise amplifier (LNA) 429b may output a second amplified input signal 433.

The single-ended receiver 506 may also include a multi-port transformer 530, a shared mixer 532, a baseband (BB) low pass filter (LPF) 542 and an analog-to-digital converter (ADC) 544 similar to corresponding components 430, 432, 442 and 444 described in connection with FIG. 4. For example, the multi-port transformer 530 may include a first primary coil (i.e., inductor) L1 550a, a second primary coil L2 550b, a secondary coil L3 550c and center tap 526 that corresponds to similar elements 450a, 450b, 450c and 426 described in connection with FIG. 4. In this manner, the first amplified input signal 531 and the second amplified input signal 533 may output a receiver output signal 520 similar to, the first amplified input signal 431 and the second amplified input signal 433 outputting a receiver output signal 420 as described above in FIG. 4.

Figure 6:
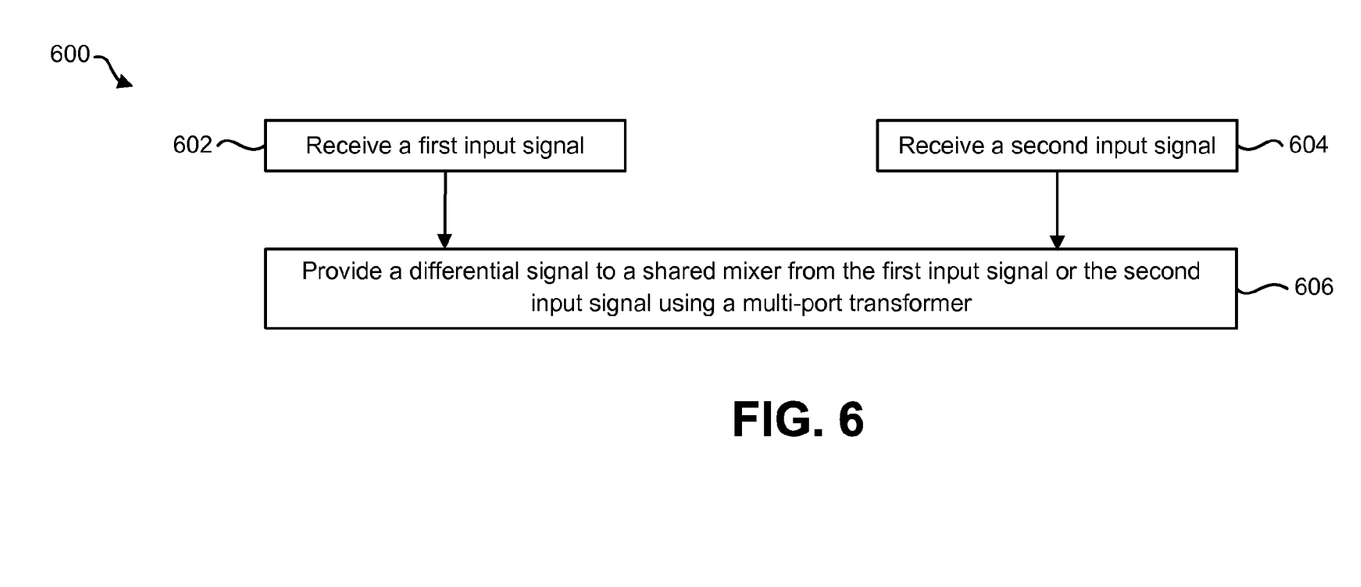
FIG. 6 is a flow diagram of a method for receiving a wireless signal using a single-ended receiver.

FIG. 6 is a flow diagram of a method 600 for receiving a wireless signal using a single-ended receiver 106. The method 600 may be performed by a wireless device 102. In one configuration, the method 600 may be performed by a single-ended receiver 106 on the wireless device 102. The single-ended receiver 106 may receive 602 a first input signal 116. The single-ended receiver 106 may also receive 604 a second input signal 118. The first input signal 116 and the second input signal 118 may or may not be received simultaneously. The single-ended receiver 106 may provide 606 a differential signal 357 to a shared mixer 232 from the first input signal 116 or the second input signal 118 using a multi-port transformer 230.

For example, the multi-port transformer 230 may use the first primary coil L1 350a coupled to the secondary coil L3 350c to provide a differential signal 357 from the first input signal 116 to the shared mixer 232. Likewise, the multi-port transformer 230 may use the second primary coil L2 350b coupled to the secondary coil L3 350c to provide a differential signal 357 from the second input signal 118 to the shared mixer 232.

Figure 7:
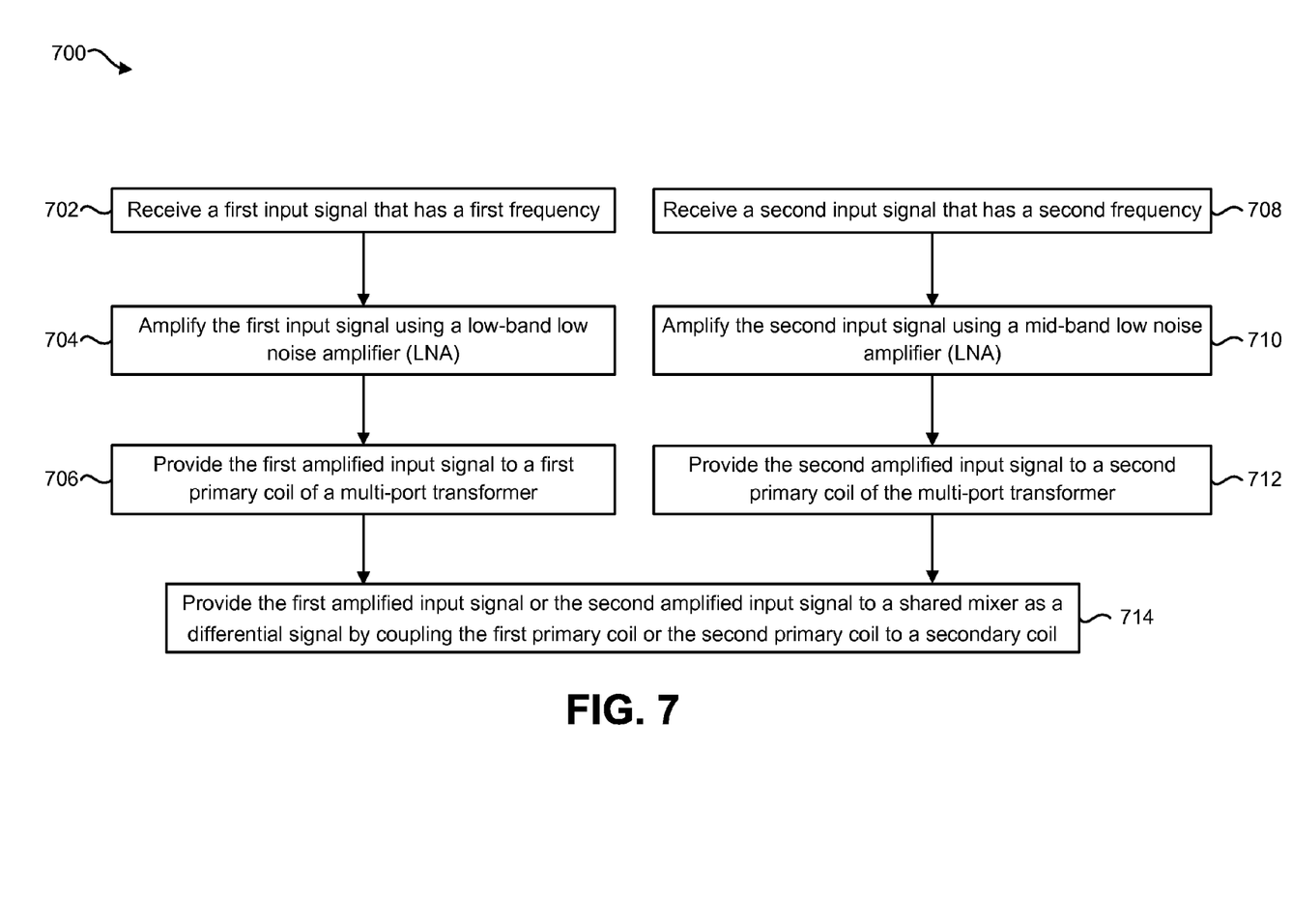
FIG. 7 is a flow diagram of another method for receiving a wireless signal using a single-ended receiver.

FIG. 7 is a flow diagram of another method 700 for receiving a wireless signal using a single-ended receiver 106. The method 700 may be performed by a wireless device 102. In one configuration, the method 700 may be performed by a single-ended receiver 106 on the wireless device 102. The single-ended receiver 106 may receive 702 a first input signal 116 that has a first frequency. For example, the first input signal 116 may be a low-frequency input signal.

The single-ended receiver 106 may amplify 704 the first input signal 116 using a low-frequency low noise amplifier (LNA) 327. The single-ended receiver 106 may provide 706 the first amplified input signal 331 to a first primary coil L1 350a of a multi-port transformer 230.

The single-ended receiver 106 may receive 708 a second input signal 118 that has a second frequency. For example, the second input signal 118 may be a high-frequency input signal. Either the first input signal 116 or the second input signal 118 may be provided to the single-ended receiver 106 by a filter/duplexer 114. The single-ended receiver 106 may amplify 710 the second input signal 118 using a high-frequency low noise amplifier (LNA) 329.

The single-ended receiver 106 may provide 712 the second amplified input signal 333 to a second primary coil L2 350b of the multi-port transformer 230. The single-ended receiver 106 may provide 714 a differential signal 357 from the multi-port transformer 230 to a shared mixer 232. In one configuration, the differential signal 357 may be a differential signal output from the first input signal 116. In another configuration, the differential signal 357 may be a differential signal output from the second input signal 118.

The single-ended receiver 106 may provide 714 the first amplified input signal 331 or the second amplified input signal 333 to the shared mixer 232 as a differential signal 357 by coupling the first primary coil L1 350a or the second primary coil L2 350b to a secondary coil L3 350c. The single-ended receiver 106 may provide 714 the first amplified input signal 331 to the shared mixer 232 by coupling the first primary coil L1 350a to the secondary coil L3 350c. Similarly, the single-ended receiver 106 may provide 714 the second amplified input signal 333 to the shared mixer 232 by coupling the second primary coil L2 350b to a secondary coil L3 350c.

Figure 8:
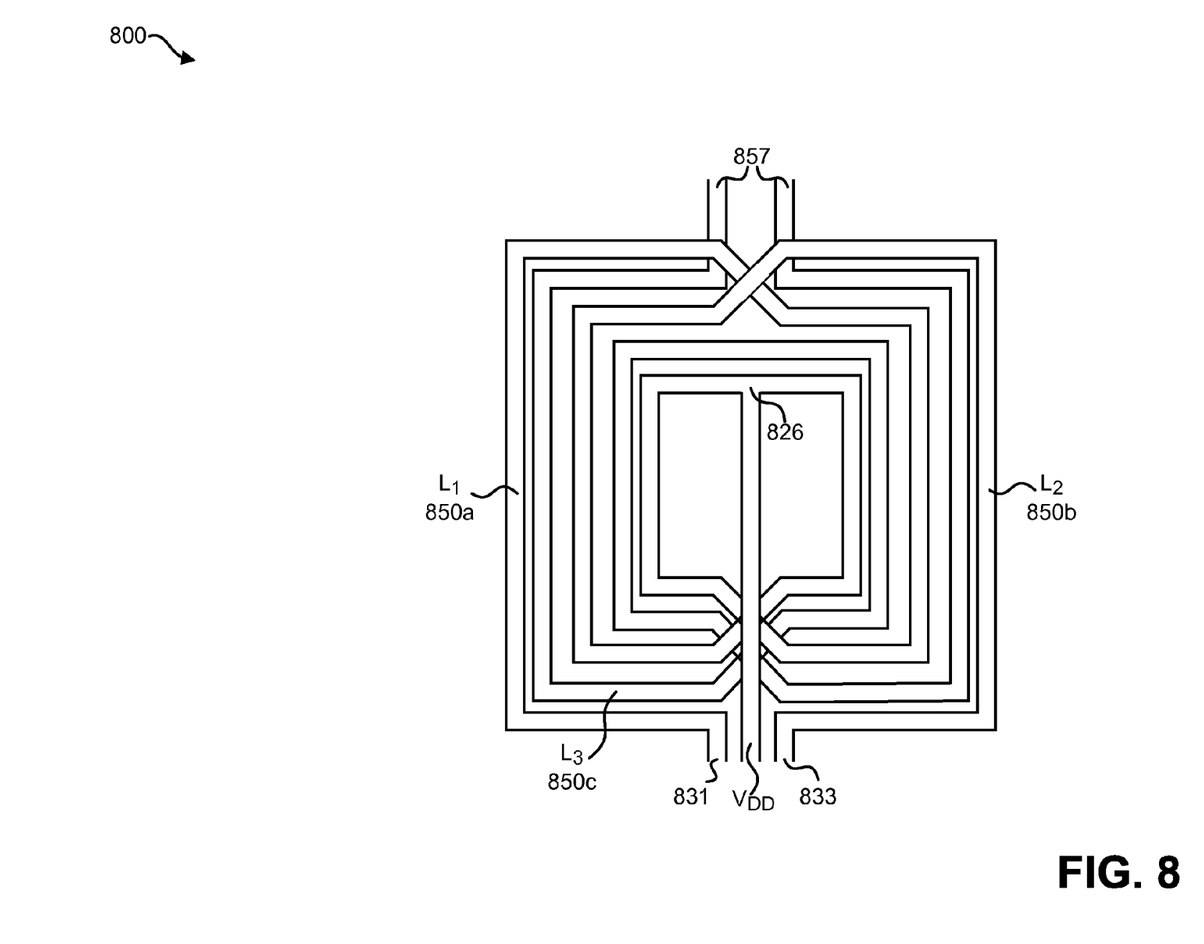
FIG. 8 is a layout diagram illustrating one configuration of a single-ended receiver.

FIG. 8 is a layout diagram illustrating one configuration 800 of a single-ended receiver 106. FIG. 8 may illustrate one implementation of the multi-port transformer 230 of FIG. 2. The single-ended receiver layout may include a first primary coil (i.e., inductor) L1 850a, a second primary coil L2 850b and a secondary coil L3 850c. The first primary coil L1 850a and the second primary coil L2 850b may be the same type or different types of inductors. The first primary coil L1 850a may receive input from a first amplified input signal 831. The second primary coil L2 850b may receive input from a second amplified input signal 833. The secondary coil L3 850c may output a produce a differential signal 857. The single-ended receiver layout may also include a center tap 826 that is between the first primary coil L1 850a and the second primary coil L2 850b. The center tap 826 may be coupled to a voltage supply ($V_{DD}$).

Figure 9:
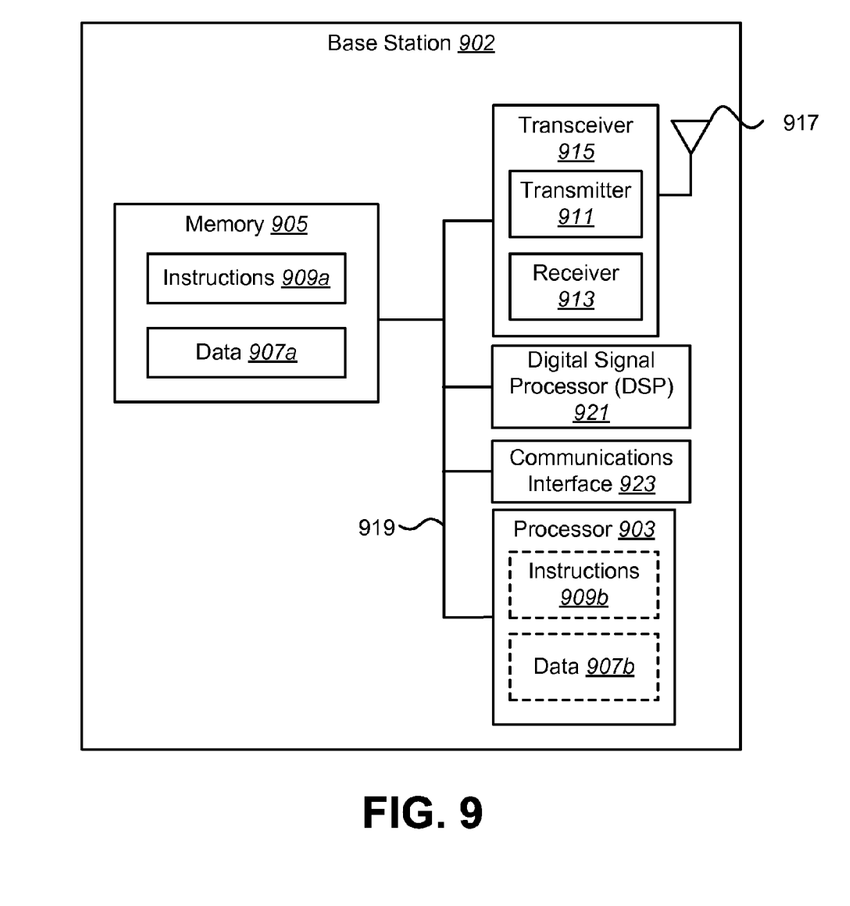
FIG. 9 illustrates certain components that may be included within a base station.

FIG. 9 illustrates certain components that may be included within a base station 902. A base station 902 may also be referred to as, and may include some or all of the functionality of, an access point, a broadcast transmitter, a node B, an evolved node B, etc. For example, the base station 902 may be the wireless device 102 of FIG. 1. The base station 902 may include a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the base station 902 of FIG. 9, in an alternative configuration, a combination of processors (e.g., an ARM and DSP) could be used.

The base station 902 also includes memory 905. The memory 905 may be any electronic component capable of storing electronic information. The memory 905 may be embodied as random access memory (RAM), read only memory (ROM), magnetic disk storage media, optical storage media, flash memory devices in RAM, on-board memory included with the processor, EPROM memory, EEPROM memory, registers and so forth, including combinations thereof.

Data 907*a* and instructions 909*a* may be stored in the memory 905. The instructions 909*a* may be executable by the processor 903 to implement the methods disclosed herein. Executing the instructions 909*a* may involve the use of the data 907*a* that is stored in the memory 905. When the processor 903 executes the instructions 909*a*, various portions of the instructions 909*b* may be loaded onto the processor 903, and various pieces of data 907*b* may be loaded onto the processor 903.

The base station 902 may also include a transmitter 911 and a receiver 913 to allow transmission and reception of signals to and from the base station 902. The transmitter 911 and receiver 913 may be collectively referred to as a transceiver 915. The receiver 913 of FIG. 9 may be one configuration of the receiver 104 illustrated in FIG. 1 and/or the receiver 204 illustrated in FIG. 2. An antenna 917 may be electrically coupled to the transceiver 915.

The base station 902 may include a Digital Signal Processor (DSP) 921. The base station 902 may also include a communications interface 923. The communications interface 923 may allow a user to interact with the base station 902.

The various components of the base station 902 may be coupled together by one or more buses, which may include a power bus, a control signal bus, a status signal bus, a data bus, etc. For the sake of clarity, the various buses are illustrated in FIG. 9 as a bus system 919.

Figure 10:
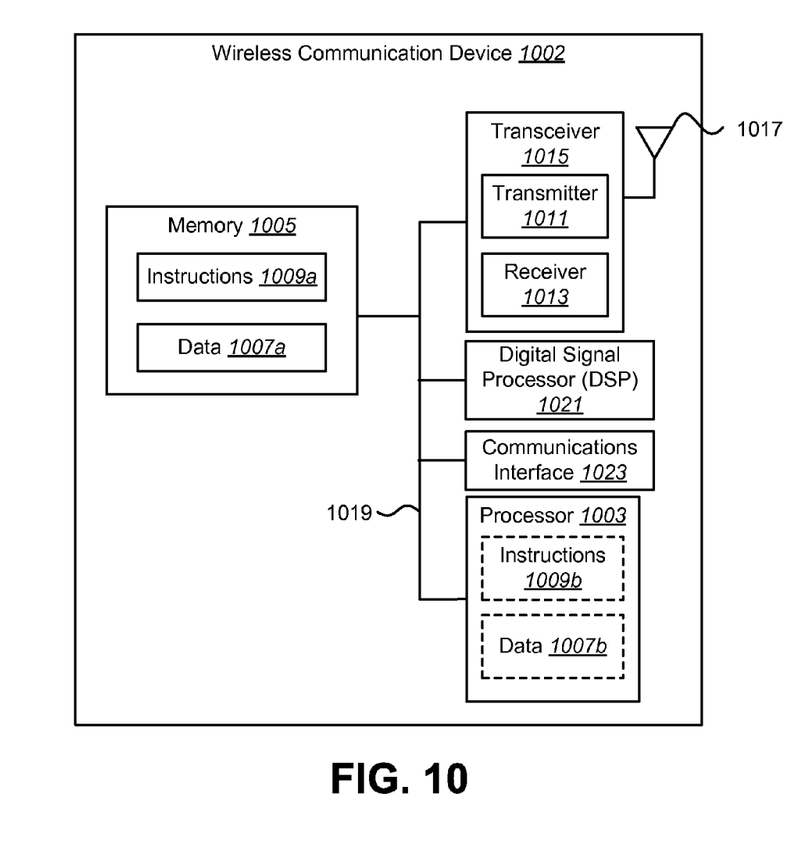
FIG. 10 illustrates certain components that may be included within a wireless communication device.

FIG. 10 illustrates certain components that may be included within a wireless device 1002. The wireless device 1002 may be an access terminal, a mobile station, a user equipment (UE), etc. For example, the wireless device 1002 may be the wireless device 102 of FIG. 1. Additionally or alternatively, the wireless device 1002 may include the receiver 104 illustrated in FIG. 1 and/or the receiver 204 illustrated in FIG. 2. The wireless device 1002 includes a processor 1003. The processor 1003 may be a general purpose single- or multi-chip microprocessor (e.g., an ARM), a special purpose microprocessor (e.g., a DSP), a microcontroller, a programmable gate array, etc. The processor 1003 may be referred to as a central processing unit (CPU). Although just a single processor 1003 is shown in the wireless device 1002 of FIG. 10, in an alternative configuration, a combination of processors (e.g., an ARM and DSP) could be used.

The wireless device 1002 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007*a* and instructions 1009*a* may be stored in the memory 1005. The instructions 1009*a* may be executable by the processor 1003 to implement the methods disclosed herein. Executing the instructions 1009*a* may involve the use of the data 1007*a* that is stored in the memory 1005. When the processor 1003 executes the instructions 1009*a*, various portions of the instructions 1009*b* may be loaded onto the processor 1003, and various pieces of data 1007*b* may be loaded onto the processor 1003.

The wireless device 1002 may also include a transmitter 1011 and a receiver 1013 to allow transmission and reception of signals to and from the wireless device 1002. The transmitter 1011 and receiver 1013 may be collectively referred to as a transceiver 1015. An antenna 1017 may be electrically coupled to the transceiver 1015.

The wireless device 1002 may include a Digital Signal Processor (DSP) 1021. The wireless device 1002 may also include a communications interface 1023. The communications interface 1023 may allow a user to interact with the wireless device 1002.

The various components of the wireless device 1002 may be coupled together by one or more buses, which may include a power bus, a control signal bus, a status signal bus, a data bus, etc. For the sake of clarity, the various buses are illustrated in FIG. 10 as a bus system 1019.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 5 and 6, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A single-ended receiver, comprising:
    a multi-port transformer that outputs a differential signal, the multi-port transformer comprising:
        a first primary coil that is coupled to an output of a first low noise amplifier;
        a second primary coil that is distinct from the first primary coil and that is coupled to an output of a second low noise amplifier; and
        a first secondary coil; and
    a shared mixer that receives the differential signal from the multi-port transformer.

2. The single-ended receiver of claim 1, wherein the multi-port transformer further comprises:
    a first coupling between the first primary coil and the second primary coil;
    a second coupling between the first primary coil and the first secondary coil; and
    a third coupling between the second primary coil and the first secondary coil.

3. The single-ended receiver of claim 1, wherein the first low noise amplifier receives a first input signal and wherein the second low noise amplifier receives a second input signal.

4. The single-ended receiver of claim 3, wherein the first input signal is active and the second input signal is inactive and wherein the multi-port transformer outputs the differential signal based on the first input signal.

5. The single-ended receiver of claim 3, wherein the first input signal is inactive and the second input signal is active and wherein the multi-port transformer outputs the differential signal based on the second input signal.

6. The single-ended receiver of claim 3, wherein the first input signal has a first frequency and the second input signal has a second frequency.

7. The single-ended receiver of claim 1, wherein the multi-port transformer further comprises a center tap between the first primary coil and the second primary coil, and wherein the center tap is coupled to a voltage supply.

8. The single-ended receiver of claim 1, wherein the first low noise amplifier comprises a low-frequency low noise amplifier for operation with a low-frequency signal, and wherein the second low noise amplifier comprises a high-frequency low noise amplifier for operation with a high-frequency signal.

9. The single-ended receiver of claim 8, wherein the first low noise amplifier receives a low-frequency input signal, and wherein the second low noise amplifier receives a high-frequency second signal.

10. The single-ended receiver of claim 1, further comprising a baseband low pass filter coupled to the shared mixer.

11. The single-ended receiver of claim 10, further comprising an analog-to-digital converter coupled to the baseband low pass filter, wherein the baseband low pass filter outputs a receiver output signal.

12. The single-ended receiver of claim 1, wherein the first secondary coil is coupled to a first shared mixer input and a second shared mixer input of the shared mixer.

13. The single-ended receiver of claim 12, further comprising:
    a first capacitor that couples the first secondary coil to the first shared mixer input; and
    a second capacitor that couples the first secondary coil to the second shared mixer input.

14. The single-ended receiver of claim 1, further comprising an additional first low noise amplifier in parallel with the first low noise amplifier and an additional second low noise amplifier parallel with the second low noise amplifier.

15. The single-ended receiver of claim 14, wherein the additional first low noise amplifier receives a first input signal, and wherein the additional second low noise amplifier receives a second input signal.

16. The single-ended receiver of claim 15, wherein the first input signal has a first frequency and the second input signal has a second frequency.

17. A method for receiving a wireless signal, the method comprising:
   receiving a first input signal;
   receiving a second input signal; and
   providing a differential signal to a shared mixer from one of the first input signal and the second input signal using a multi-port transformer comprising a first primary coil, a second primary coil that is distinct from the first primary coil, and a first secondary coil.

18. The method of claim 17, further comprising amplifying the first input signal using a first low noise amplifier.

19. The method of claim 18, wherein the first low noise amplifier comprises a low-frequency low noise amplifier for operation with a low-frequency signal.

20. The method of claim 17, further comprising amplifying the second input signal using a second low noise amplifier.

21. The method of claim 20, wherein the second low noise amplifier comprises a high-frequency low noise amplifier for operation with a high-frequency signal.

22. The method of claim 17, wherein the first input signal has a first frequency and the second input signal has a second frequency.

23. The method of claim 17, wherein a first low noise amplifier receives the first input signal and a second low noise amplifier receives the second input signal.

24. The method of claim 23, wherein the first input signal is active and the second input signal is inactive, and wherein the multi-port transformer outputs the differential signal based on the first input signal.

25. The method of claim 23, wherein the first input signal is inactive and the second input signal is active and wherein the multi-port transformer outputs the differential signal based on the second input signal.

26. The method of claim 17, wherein:
   the first primary coil is coupled to an output of a first low noise amplifier; and
   the second primary coil is coupled to an output of a second low noise amplifier.

27. The method of claim 26, wherein the multi-port transformer further comprises a center tap between the first primary coil and the second primary coil.

28. The method of claim 26, wherein the multi-port transformer further comprises:
   a first coupling between the first primary coil and the second primary coil;
   a second coupling between the first primary coil and the first secondary coil; and
   a third coupling between the second primary coil and the first secondary coil.

29. The method of claim 28, wherein the first secondary coil is coupled to a first shared mixer input and a second shared mixer input of the shared mixer.

30. The method of claim 17, wherein the method is performed by a single-ended receiver on a wireless device, and wherein the single-ended receiver comprises the shared mixer and the multi-port transformer.

31. The method of claim 30, wherein the single-ended receiver further comprises a baseband low pass filter coupled to the shared mixer.

32. The method of claim 31, wherein the single-ended receiver further comprises an analog-to-digital converter coupled to the baseband low pass filter, and wherein the baseband low pass filter outputs a receiver output signal.

33. The method of claim 30, wherein the single-ended receiver further comprises:
   a first capacitor coupled between the first secondary coil and the first shared mixer input; and
   a second capacitor coupled between the first secondary coil and the second shared mixer input.

34. The method of claim 17, wherein the multi-port transformer further comprises an additional first low noise amplifier parallel with the first low noise amplifier and an additional second low noise amplifier parallel with the second low noise amplifier.

35. The method of claim 34, further comprising, wherein the additional first low noise amplifier receives the first input signal, and wherein the additional second low noise amplifier receives the second input signal.

36. The method of claim 35, wherein the first input signal has a first frequency and the second input signal has a second frequency.

37. An apparatus, comprising:
   means for receiving a first input signal;
   means for receiving a second input signal; and
   means for providing a differential signal to a shared mixer from one of the first input signal and the second input signal using a multi-port transformer comprising a first primary coil, a second primary coil that is distinct from the first primary coil, and a first secondary coil.

38. The apparatus of claim 37, wherein:
   the first primary coil is coupled to an output of a first low noise amplifier; and
   the second primary coil is coupled to an output of a second low noise amplifier.

39. The apparatus of claim 38, wherein the multi-port transformer further comprises:
   a first coupling between the first primary coil and the second primary coil;
   a second coupling between the first primary coil and the first secondary coil; and
   a third coupling between the second primary coil and the first secondary coil.

40. A computer-program product for receiving a wireless signal, the computer-program product comprising a non-transitory computer-readable medium having instructions thereon, the instructions comprising:
   code for causing a wireless device to receive a first input signal;
   code for causing the wireless device to receive a second input signal; and
   code for causing the wireless device to provide a differential signal to a shared mixer from one of the first input signal and the second input signal using a multi-port transformer comprising a first primary coil, a second primary coil that is distinct from the first primary coil, and a first secondary coil.

41. The computer-program product of claim 40, wherein:
   the first primary coil is coupled to an output of a first low noise amplifier; and
   the second primary coil is coupled to an output of a second low noise amplifier.

42. The computer-program product of claim 41, wherein the multi-port transformer further comprises:
   a first coupling between the first primary coil and the second primary coil;
   a second coupling between the first primary coil and the first secondary coil; and
   a third coupling between the second primary coil and the first secondary coil.

* * * * *